(12) United States Patent
Nakayamada et al.

(10) Patent No.: US 8,502,175 B2
(45) Date of Patent: Aug. 6, 2013

(54) CHARGED PARTICLE BEAM PATTERN FORMING APPARATUS AND CHARGED PARTICLE BEAM PATTERN FORMING METHOD

(75) Inventors: Noriaki Nakayamada, Kanagawa (JP); Seiji Wake, Shizuoka (JP); Hideo Inoue, Kanagawa (JP); Akihito Anpo, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 169 days.

(21) Appl. No.: 13/170,426

(22) Filed: Jun. 28, 2011

(65) Prior Publication Data

US 2012/0007002 A1   Jan. 12, 2012

(30) Foreign Application Priority Data

Jun. 30, 2010   (JP) ................ 2010-148843

(51) Int. Cl.
*G21K 5/10* (2006.01)
*H01J 37/08* (2006.01)

(52) U.S. Cl.
USPC .............. 250/492.22; 250/492.3; 250/492.2; 250/396 R; 250/491.1

(58) Field of Classification Search
USPC ................ 250/492.22, 492.3, 492.2, 396 R, 250/491.1
See application file for complete search history.

(56) References Cited

U.S. PATENT DOCUMENTS

| | | | |
|---|---|---|---|
| 6,580,075 B2 | 6/2003 | Kametani et al. | |
| 7,164,141 B2 | 1/2007 | Kurokawa | |
| 7,202,488 B2 | 4/2007 | Ota et al. | |
| 7,652,271 B2 | 1/2010 | Wake et al. | |
| 7,705,322 B2 | 4/2010 | Nishimura et al. | |
| 2009/0206282 A1 | 8/2009 | Ogino et al. | |
| 2009/0242787 A1* | 10/2009 | Nakayamada et al. | ... 250/396 R |
| 2010/0133433 A1* | 6/2010 | Tanimoto et al. | ............. 250/310 |
| 2011/0031387 A1* | 2/2011 | Nakayamada et al. | .... 250/252.1 |

FOREIGN PATENT DOCUMENTS

| | | |
|---|---|---|
| JP | 2007-324175 | 12/2007 |
| JP | 2009-260250 | 11/2009 |

OTHER PUBLICATIONS

U.S. Appl. No. 13/235,432, filed Sep. 18, 2011, Nakayamada et al.
U.S. Appl. No. 13/251,786, filed Jan. 17, 2012, Inoue.
U.S. Appl. No. 13/431,509, filed Mar. 27, 2012, Inoue.
Masaru Miyazaki, et al., "Deflection errors due to sample potential in electron beam lithography machine", J. Phys. E: Sci. Instrum., vol. 14, 1981, 3 pages.

(Continued)

*Primary Examiner* — Nikita Wells
*Assistant Examiner* — Meeenakshi Sahu
(74) *Attorney, Agent, or Firm* — Oblon, Spivak, McClelland, Maier & Neustadt, L.L.P.

(57) ABSTRACT

A charged particle beam pattern forming apparatus, includes a charge amount distribution calculation unit configured to calculate a charge amount distribution charged by vertical incidence of a charged particle beam on a pattern forming region of a target object; a position correction unit configured to calculate, using the charge amount distribution charged, a corrected position of each pattern forming position corrected for a misregistration amount including a misregistration amount dependent on a deflection position where the charged particle beam is deflected, the misregistration amount caused by an amount of charge; and a pattern generator configured to form a pattern in the corrected position by using the charged particle beam.

10 Claims, 9 Drawing Sheets

OTHER PUBLICATIONS

Maris A. Sturans, et al., "Positional errors due to substrate charging in e-beam lithography tools", SPIE vol. 1604 11$^{th}$ Annual BACUS Symposium on Photomask Technology, 1991, pp. 36-44.

Hiroyuki Itoh, et al., "Charging effects on trilevel resist and metal layer in electron-beam lithography", J. Vac. Sci. Technol. B 9 (6), Nov./Dec. 1991, pp. 3039-3042.

* cited by examiner

CHARGED PARTICLE BEAM PATTERN FORMING APPARATUS AND CHARGED PARTICLE BEAM PATTERN FORMING METHOD

CROSS-REFERENCE TO RELATED APPLICATION

This application is based upon and claims the benefit of priority from prior Japanese Patent Application No. 2010-148843 filed on Jun. 30, 2010 in Japan, the entire contents of which are incorporated herein by reference.

BACKGROUND OF THE INVENTION

1. Field of the Invention

The present invention relates to a charged particle beam pattern forming apparatus and a charged particle beam pattern forming method and, for example, relates to a charged particle beam pattern forming apparatus and method capable of correcting misregistration originating in the amount of charge when a pattern is formed on a target object by using a variable-shaped electron beam.

2. Related Art

A lithography technique which leads development of micropatterning of a semiconductor device is a very important process for exclusively generating a pattern in semiconductor manufacturing processes. In recent years, with an increase in integration density of an LSI, a circuit line width required for semiconductor devices is getting smaller year by year. In order to form a desired circuit pattern on such semiconductor devices, a high-precision original pattern (also called a reticle or a mask) is necessary. In this case, an electron beam pattern forming technique essentially has an excellent resolution, and is used in production of high-precision original patterns.

FIG. 12 is a conceptual diagram for explaining an operation of a variable-shaped electron beam pattern forming apparatus. The variable-shaped electron beam (EB: Electron Beam) pattern forming apparatus operates as described below. In a first aperture plate 410, a quadrangular, for example, a rectangular opening 411 to shape an electron beam 330 is formed. In a second aperture plate 420, a variable-shaped opening 421 to shape the electron beam 330 having passed through the opening 411 of the first aperture plate 410 into a desired quadrangular shape is formed. The electron beam 330 irradiated from a charged particle source 430 and having passed through the opening 411 of the aperture plate 410 is deflected by a deflector and passes through a part of the variable-shaped opening 421 of the second aperture plate 420 before a target object 340 mounted on a stage continuously moving in a predetermined direction (for example, the X direction) is irradiated with the electron beam 330. That is, a quadrangular shape which can pass through both the opening 411 of the first aperture plate 410 and the variable-shaped opening 421 of the second aperture plate 420 is formed in a pattern forming region on the target object 340 mounted on the stage continuously moving in the X direction. The scheme for causing a beam to pass through both the opening 411 of the first aperture plate 410 and the variable-shaped opening 421 of the second aperture plate 420 to form an arbitrary shape is called a variable shaped beam (VSB) scheme.

When a target object such as a mask to which a resist film is applied is irradiated with an electron beam, an irradiation position and the vicinity thereof may be charged with an electron beam irradiated in the past. Misregistration originating in such a charging phenomenon has not been seen as a problem in a variable-shaped electron beam pattern forming apparatus, but with the development of micropatterning, as described above, misregistration originating in such a charging phenomenon is becoming an issue. Particularly with the introduction of double-patterning technique, more improved precision of the pattern position of a photomask is demanded.

As a method of correcting the misregistration of beam irradiation, a method of preventing a charge on a resist surface by forming a charge dissipation layer (CDL) on a resist layer has been known. However, the charge dissipation layer has basically acidic properties and so is not compatible with a chemically amplified resist. Moreover, it is necessary to install a new facility to form a charge dissipation layer, further increasing manufacturing costs of photomasks. Thus, it is desirable to make a charging effect correction (CEC) without using the charge dissipation layer.

Regarding the correction of misregistration originating in a charge, a pattern forming apparatus that calculates an amount of correction of a beam irradiation position based on electric field intensity and irradiates the beam irradiation position with a beam based on the amount of correction is proposed (see JP-A-2007-324175, for example). According to such an apparatus, it is assumed that the linear proportionality is established between the distribution of irradiation amount and the distribution of charge amount and the distribution of registration amount is calculated from the distribution of irradiation amount via a linear response function.

To correct misregistration of the irradiation position originating in such a charging phenomenon precisely, it is necessary to calculate a beam trajectory by considering beam incident angle dependency by a deflector. However, misregistration of the irradiation position originating in a charging phenomenon has been corrected under the assumption that an electron beam is incident vertically. Thus, it has been impossible to make a precise correction. Further, according to a pattern forming method in which the stage moves continuously, the deflection position is determined by a data processing operation for forming a pattern in the end and so is revealed only during pattern forming. Accordingly, it is difficult to determine the deflection position before forming a pattern. Therefore, the stage continuously moving method has a problem that it is difficult to make a position correction that takes beam incident angle dependency into consideration (deflection position dependency) offline in advance before forming a pattern.

BRIEF SUMMARY OF THE INVENTION

A charged particle beam pattern forming apparatus, according to an embodiment, includes a charge amount distribution calculation unit configured to calculate a charge amount distribution charged by vertical incidence of a charged particle beam on a pattern forming region of a target object; a position correction unit configured to calculate, using the charge amount distribution charged, a corrected position of each pattern forming position corrected for a misregistration amount including a misregistration amount dependent on a deflection position where the charged particle beam is deflected, the misregistration amount caused by an amount of charge; and a pattern generator configured to form a pattern in the corrected position by using the charged particle beam.

A charged particle beam pattern forming method, according to an embodiment, includes calculating a charge amount distribution charged by vertical incidence of a charged particle beam on a pattern forming region of a target object;

calculating a corrected position in each pattern forming position corrected for a misregistration amount including a misregistration amount dependent on a deflection position where the charged particle beam is deflected, the misregistration amount caused by an amount of charge; and forming a pattern in the corrected position by using the charged particle beam.

DETAILED DESCRIPTION OF THE INVENTION

First Embodiment

In an embodiment below, a configuration using an electron beam will be described as an example of a charged particle beam. The charged particle beam is not limited to an electron beam, and another charged particle beam such as an ion beam may be used.

In the embodiment, an apparatus and a method that correct misregistration, or "displacement" of the irradiation position originating in the amount of charge that takes deflection position dependency into consideration will be described.

Figure 1:
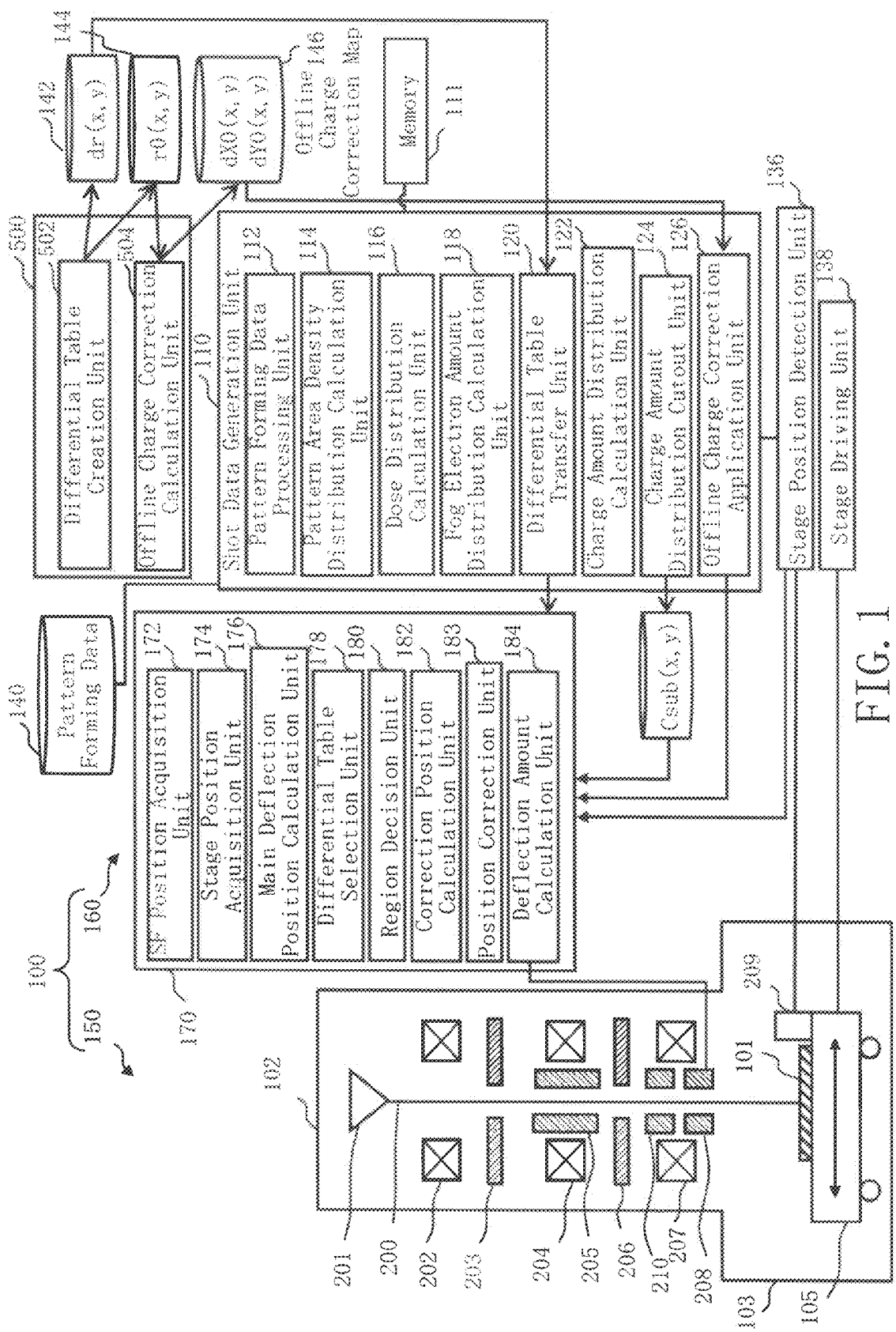
FIG. 1 is a conceptual diagram showing an example of a principal unit configuration of a pattern forming apparatus according to a first embodiment.

FIG. 1 is a conceptual diagram showing an example of the principal unit configuration of a pattern forming apparatus according to the first embodiment. In FIG. 1, a pattern forming apparatus 100 includes a pattern generator, or "writing unit" 150 and a control unit 160. The pattern forming apparatus 100 is as an example of the charged particle beam pattern forming or "writing or drawing" apparatus. The pattern generator 150 includes an electron lens barrel 102 and a pattern forming chamber or "writing chamber" 103. In the electron lens barrel 102, an electron gun assembly 201, an illumination lens 202, a first aperture plate 203, a projection lens 204, a deflector 205, a second aperture plate 206, an objective lens 207, a main deflector 208, and a sub-deflector 210 are arranged. In the pattern forming chamber 103, an XY stage 105 is arranged. On the XY stage 105, a target object 101 on which a pattern is to be formed is placed. The target object 101 includes a photomask used for exposure in the semiconductor manufacture, a wafer from which a semiconductor device is formed and the like. The photomask on which a pattern is formed includes mask blanks on which no pattern is formed. It is needless to say that when a pattern is formed, a photosensitive resist film is formed on the target object by an electron beam. Moreover, on the XY stage 105, a mirror 209 for measuring the stage position is arranged in a position that is different from the position where the target object 101 is placed.

The control unit 160 includes a control computer 110, a memory 111, a stage position detection unit 136, a stage driving unit 138, a deflection control circuit 170, and storage devices 140, 142, 144, 146 such as magnetic disk drives. The control computer 110, the memory 111, the stage position detection unit 136, the stage driving unit 138, the deflection control circuit 170, and storage devices 140, 142, 144, 146 are mutually connected by a bus (not shown). The deflection control circuit 170 is connected to the main deflector 208.

In the control computer 110, functions such as a pattern forming data processing unit 112, a pattern area density distribution calculation unit 114, a dose distribution calculation unit 116, a fog electron amount distribution calculation unit 118, a differential table transfer unit 120, a charge amount distribution calculation unit 122, a charge amount distribution cutout unit 124, and an offline charge correction application unit 126 are arranged. The pattern forming data processing unit 112, the pattern area density distribution calculation unit 114, the dose distribution calculation unit 116, the fog electron amount distribution calculation unit 118, the differential table transfer unit 120, the charge amount distribution calculation unit 122, the charge amount distribution cutout unit 124, and the offline charge correction application unit 126 may be configured by hardware including electric circuits. Alternatively, processing content of each function of the pattern forming data processing unit 112, the pattern area density distribution calculation unit 114, the dose distribution calculation unit 116, the fog electron amount distribution calculation unit 118, the differential table transfer unit 120, the charge amount distribution calculation unit 122, the charge amount distribution cutout unit 124, and the offline charge correction application unit 126 may be configured by a program (software) executed by a computer. In addition, the units may be configured by combinations of such hardware and software. The units may also be configured by combinations of such hardware and firmware. Information to be input into the control computer 110 or each piece of information obtained during an arithmetic process and after the arithmetic process is stored in the memory 111 in respective timing.

In the deflection control circuit 170, functions such as a sub-field (SF) position acquisition unit 172, a stage position acquisition unit 174, a main deflection position calculation unit 176, a differential table selection unit 178, a region decision unit 180, a correction position calculation unit 182, a position correction unit 183, and a deflection amount calculation unit 184 are arranged. The SF position acquisition unit 172, the stage position acquisition unit 174, the main deflection position calculation unit 176, the differential table selection unit 178, the region decision unit 180, the correction position calculation unit 182, the position correction unit 183, and the deflection amount calculation unit 184 may be configured by hardware including electric circuits. Alternatively, processing content of each function of the SF position acquisition unit 172, the stage position acquisition unit 174, the main deflection position calculation unit 176, the differential table selection unit 178, the region decision unit 180, the correction position calculation unit 182, the position correction unit 183, and the deflection amount calculation unit 184 may be configured by a program (software) executed by a computer. In addition, the units may be configured by combinations of such hardware and software. The units may also be configured by combinations of such hardware and firmware. Information to be input into the deflection control circuit 170 or each piece of information obtained during an arithmetic process and after the arithmetic process is stored in the memory (not shown) in respective timing.

In an external computer 500 of the pattern forming apparatus 100, a differential table creation unit 502 and an offline charge correction calculation unit 504 are arranged. The differential table creation unit 502 and the offline charge correction calculation unit 504 may be configured by hardware including electric circuits. Alternatively, processing content of each function may be configured by a program (software) executed by a computer. In addition, the units may be configured by combinations of such hardware and software. The units may also be configured by combinations of such hardware and firmware.

In FIG. 1, other configuration portions than necessary for describing the first embodiment are omitted. The pattern forming apparatus 100 may include other components usually needed for the pattern forming apparatus 100, as a matter of course.

An electron beam 200 emitted from the electron gun assembly 201 illuminates the entire first aperture plate 203 having a quadrangular, for example, rectangular opening with the illumination lens 202. In this case, the electron beam 200 is shaped into a quadrangular, for example, rectangular shape. Then, the electron beam 200 of a first aperture image having passed through the first aperture plate 203 is projected on the second aperture plate 206 by the projection lens 204. The position of the first aperture image on the second aperture plate 206 can be changed by controlling deflection of the beam by the deflector 205 controlled by the deflection control circuit 170 so that a beam shape and a beam size can be changed. Then, the electron beam 200 of a second aperture image having passed through the second aperture plate 206 is focused by the objective lens 207 and deflected by, for example, the electrostatic main deflector 208 controlled by the deflection control circuit 170 before being focused on a sub-field (SF) position desired by the target object 101 on the movably arranged XY stage 105 as an irradiation position. Further, each shot position in the SF is irradiated with the electron beam 200 by the sub-deflector 210. The XY stage 105 is controlled to be driven by the stage driving unit 138. Then, the position of the XY stage 105 is detected by the stage position detection unit 136. The stage position detection unit 136 includes, for example, a laser measuring apparatus that irradiates the mirror 209 with a laser to measure the position thereof based on reflected light therefrom.

Figure 2B:
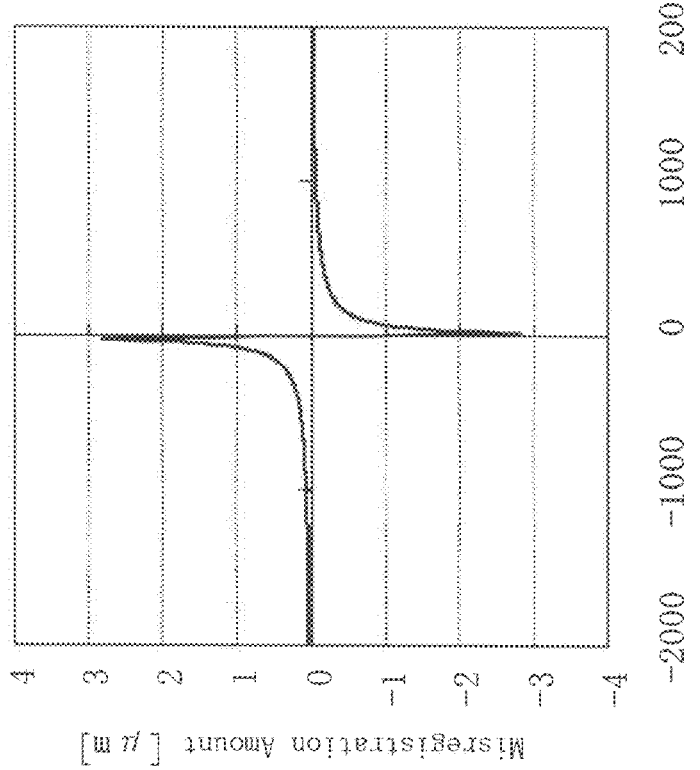
FIGS. 2A and 2B are diagrams for explaining misregistration originating in the amount of charge in the first embodiment.
Figure 2A:
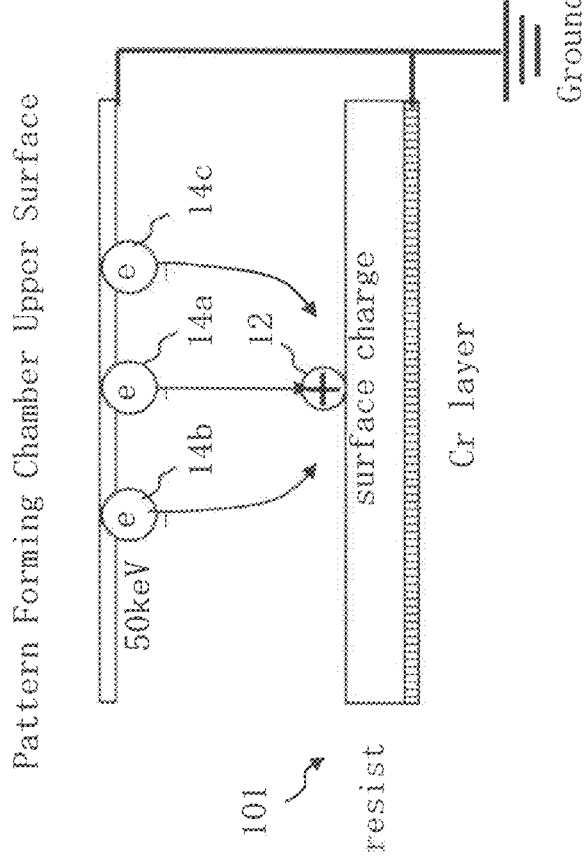

FIGS. 2A and 2B are diagrams for explaining misregistration originating in the amount of charge in the first embodiment. In FIG. 2A, if a positive point charge 12 is present on the surface of the target object 101, negative electrons 14 irradiated from an upper part of the pattern forming chamber 103 are attracted toward the point charge 12. An electron 14*a* incident immediately above the point charge 12 is attracted directly after vertical incidence. For electrons 14*b*, 14*c* vertically incident from positions deviating from immediately above the point charge 12, by contrast, trajectories thereof are deviated by being attracted toward the point charge 12. Thus, misregistration arises. In FIG. 2B, a graph showing the misregistration amount with regard to the distance from the point charge to a desired pattern forming point is shown. Here, a result of calculating the amount of beam misregistration with regard to the positive 1nC surface point charge is shown as an example. As shown in FIG. 2B, it is evident that misregistration arises under the influence of the point charge 12 within a certain range from the point charge 12.

Figure 3:
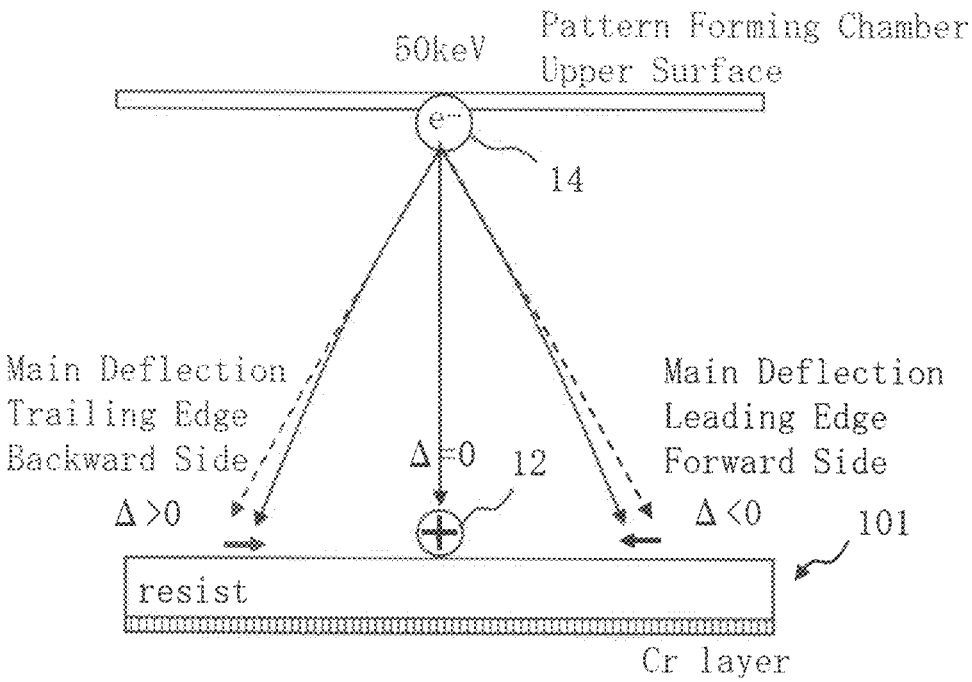
FIG. 3 is a diagram for explaining the misregistration dependent on a deflection position and originating in the amount of charge in the first embodiment.

FIG. 3 is a diagram for explaining the misregistration dependent on a deflection position and originating in the amount of charge in the first embodiment. In an actual pattern forming calculation, as shown in FIG. 2A, in addition to the electrons 14*b*, 14*c* that are vertically incident, there are many electrons that are incident after being deflected by the main deflector 208.

That is, there are electrons whose incident angle with respect to the vertical direction is not 0 degree. In such a case, misregistration ($\Delta$) is caused in the negative (−x) direction when a pattern is formed on the leading edge of a deflection region (main deflection region) in which the electron can be deflected by the main deflector 208. On the other hand, misregistration ($\Delta$) is caused in the positive (+x) direction when a pattern is formed on the trailing edge of a deflection region by being attracted by the point charge 12.

Figure 4:
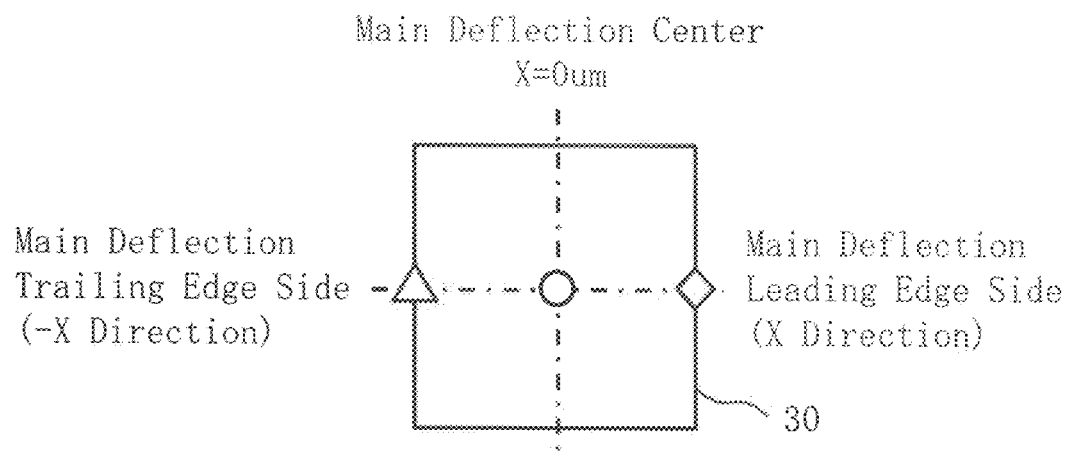
FIG. 4 is a diagram showing an example of a position relationship of a main deflection region in the first embodiment.

FIG. 4 is a diagram showing an example of a position relationship of the main deflection region in the first embodiment. In FIG. 4, the center position of a main deflection region 30 in which the electron can be deflected by the main deflector 208 is indicated by "○", the leading edge position (+x direction) by "◇", and the trailing edge position (−x direction) by "△".

Figure 5:
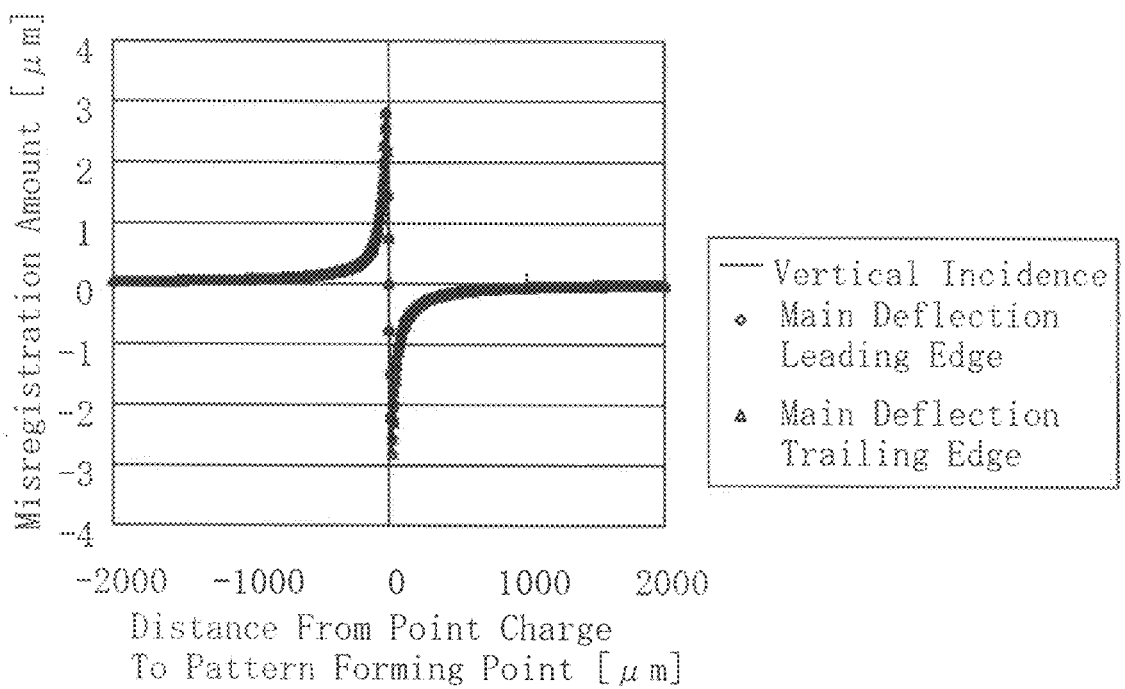
FIG. 5 is a graph superimposing and showing the misregistration amount for vertical incidence in a center position of the main deflection region, the misregistration amount for incidence in a leading edge position of the main deflection region at a predetermined incident angle from the vertical direction, and the misregistration amount for incidence in a trailing edge position of the main deflection region at the predetermined incident angle from the vertical direction in the first embodiment.

FIG. 5 is a graph superimposing and showing the misregistration amount for vertical incidence in a center position of the main deflection region, the misregistration amount for incidence in a leading edge position of the main deflection region at a predetermined incident angle from the vertical direction, and the misregistration amount for incidence in a trailing edge position of the main deflection region at the predetermined incident angle from the vertical direction in the first embodiment. In the graduation size (scale) of the graph shown in FIG. 5, it seems that there is no difference between the misregistration amount in each deflection position (the leading edge position and the trailing edge position) of the main deflection region and the misregistration amount for vertical incidence. However, the difference becomes apparent after further magnification.

Figure 6:
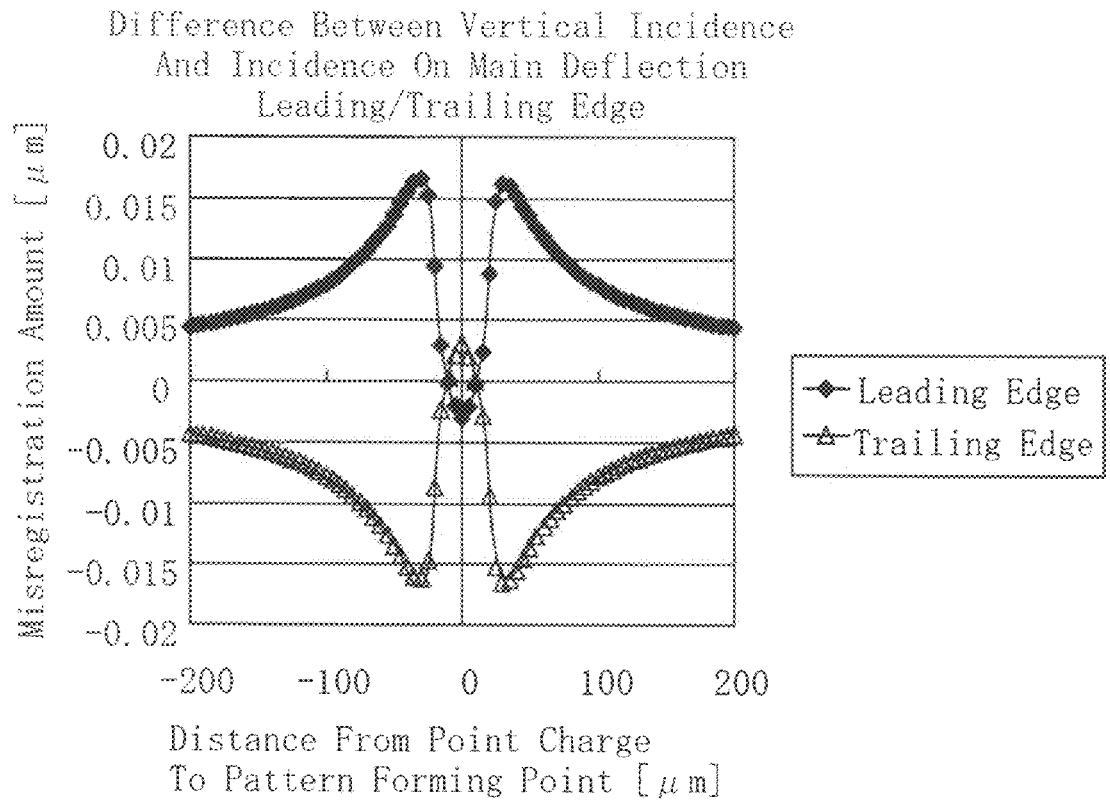
FIG. 6 is an example of a graph showing a difference between the misregistration amount for vertical incidence and the misregistration amount in each deflection position (the leading edge position and the trailing edge position) of the main deflection region in the first embodiment.

FIG. 6 is an example of a graph showing a difference between the misregistration amount for vertical incidence and the misregistration amount in each deflection position (the leading edge position and the trailing edge position) of the main deflection region in the first embodiment. In the graph shown in FIG. 6, the horizontal axis is magnified by 10 times and the vertical axis by 200 times. As shown in FIG. 6, it is evident that there arises a difference between the misregistration amount for vertical incidence and the misregistration amount in each deflection position (the leading edge position and the trailing edge position) of the main deflection region. That is, it is evident that among amounts of misregistration originating in the amount of charge, some amounts of misregistration are present that are relatively smaller than the misregistration amount for vertical incidence, but are dependent on the deflection position.

Figure 7:
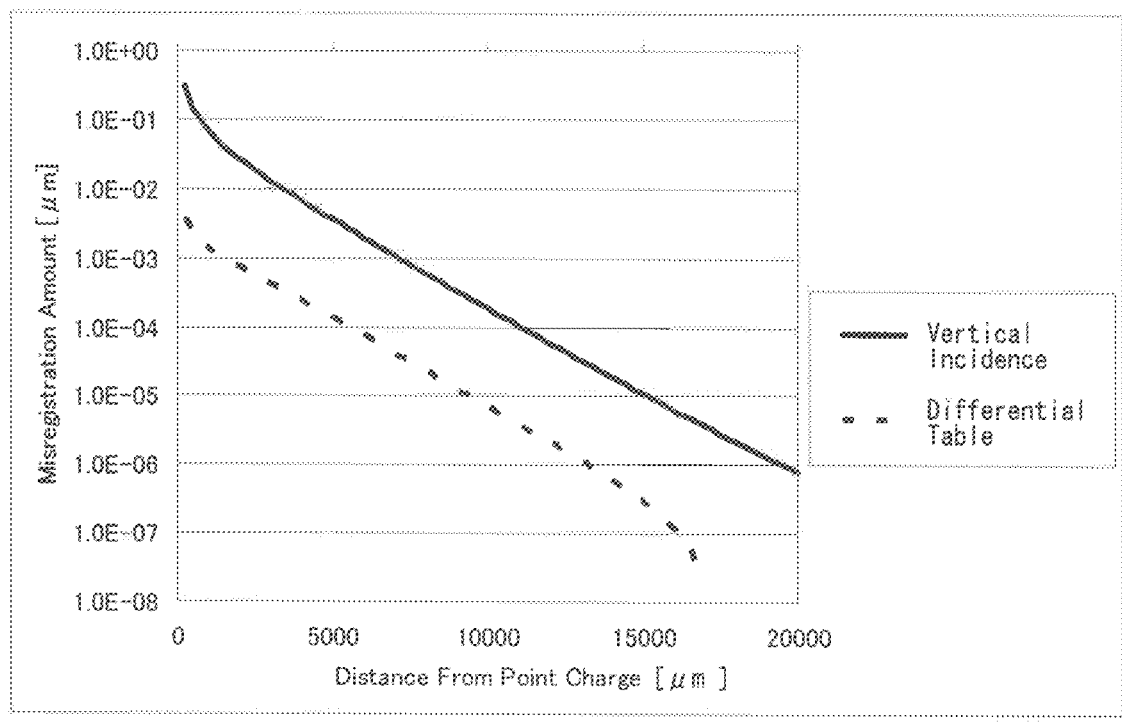
FIG. 7 is an example of a graph showing the misregistration amount for vertical incidence and a difference obtained by subtracting the misregistration amount in the deflection position (the leading edge position and the trailing edge position) of the main deflection region from the misregistration amount for vertical incidence in the first embodiment.

FIG. 7 is an example of a graph showing the misregistration amount for vertical incidence and a difference obtained by subtracting the misregistration amount in the deflection position (the leading edge position and the trailing edge position) of the main deflection region from the misregistration amount for vertical incidence in the first embodiment. In FIG. 7, the horizontal axis shows the distance from the point charge to the pattern forming position and the vertical axis shows the misregistration amount. If, for example, the range of correcting the misregistration amount is $1 \times 10^{-6}$ µm or more, 20 mm or more is necessary for the calculation range (range of influence) from the position of charge when the misregistration amount for vertical incidence is calculated. By contrast, about 13.5 mm is necessary for calculating a difference obtained by subtracting the misregistration amount in the deflection position (the leading edge position and the trailing edge position) of the main deflection region from the misregistration amount for vertical incidence. That is, the calculation range (range of influence) from the position of charge can be made narrower when a difference obtained by subtracting the misregistration amount in the deflection position (the leading edge position and the trailing edge position) of the main deflection region from the misregistration amount for vertical incidence is calculated than when the misregistration amount for vertical incidence is calculated. The calculation time is proportional to the square of the calculation range and thus, the calculation time can be made to decrease to 45.5% by calculating a difference, instead of calculating the misregistration amount for vertical incidence inside the pattern forming apparatus 100. As a result, the calculation time can be reduced. Therefore, the correction can be calculated in real time together with the pattern forming processing. The calculation can be made still faster by making the threshold for the range in which the misregistration amount is corrected still narrower. Thus, in the first embodiment, the correction amount by which the misregistration amount for vertical incidence is corrected is calculated in advance before starting to form a pattern and the correction amount for correcting the difference is calculated in real time together with the pattern forming processing in the pattern forming apparatus 100. Then, the misregistration amount that takes the deflection position into consideration can be corrected by adding both. A correction cycle or "period" is determined by calculation speeds of the charge amount distribution calculation unit 122 and the deflection amount calculation unit 184, because a correcting calculation for correcting the misregistration amount is performed without actual measurement data regarding the charge amount distribution on the target object 101. Therefore it is preferable to perform the correcting calculation by using a cycle (time period) in a sub field unit in order to perform the writing process and the correcting calculation in real time. More specifically, it is preferable to perform the correcting calculation by using a time period of 1 (µs) to several hundreds (µs).

Figure 8:
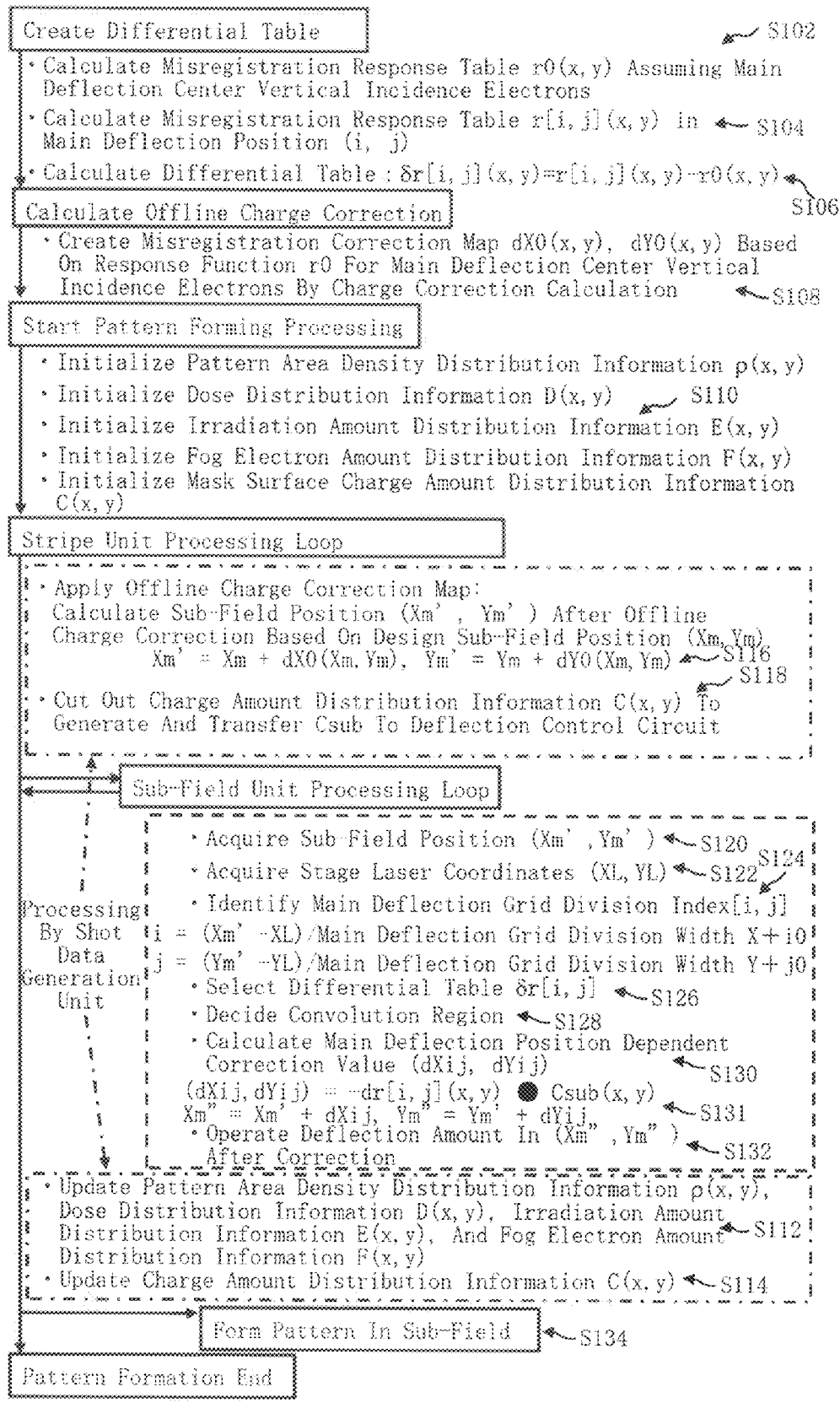
FIG. 8 is a flowchart showing principal processes of a pattern forming method in the first embodiment.

FIG. 8 is a flowchart showing principal processes of a pattern forming method in the first embodiment. In FIG. 8, as preparations, a series of processes including a misregistration response table calculation process (S102) for vertical incidence, a misregistration response table calculation process (S104) in accordance with the main deflection position, a differential table calculation process (S106), and a misregistration correction value calculation process (S108) for vertical incidence is performed in the external computer 500. Then, a series of processes including an initialization process (S110), an arithmetic process (S112) to calculate the pattern area density distribution, dose distribution, irradiation amount distribution, and fog electron amount distribution, a charge amount distribution arithmetic process (S114), an SF position correction process (S116) for vertical incidence, a charge amount distribution cutout process (S118), an SF correction position acquisition process (S120) for vertical incidence, a stage position acquisition process (S122), a main deflection position identification process (S124), a differential table selection process (S126), a calculation region decision process (S128), a main deflection position dependent correction value calculation process (S130), a position correction process (S131), a deflection amount arithmetic process (S132), and a pattern forming process (S134) are performed inside the pattern forming apparatus 100.

As the misregistration response table calculation process (S102) for vertical incidence, the differential table creation unit 502 calculates a response function (second response function) that calculates the misregistration amount (second misregistration amount) in each pattern forming position caused by vertical incidence of the electron beam 200 and originating in the amount of charge. In other words, the differential table creation unit 502 calculates a misregistration response table r0(x, y) assuming an electron vertically incident on the main deflection center and stores the misregistration response table r0(x, y) in the storage device 144. The misregistration response table r0(x, y) is an example of the response function (second response function). The misregistration response table r0(x, y) may be created by another function or a user without being created by the differential table creation unit 502. The misregistration amount is determined by evaluating a convolution integral of a response function over the charge amount distribution. Thus, the misregistration response table r0(x, y) can be calculated, after the misregistration amount in each pattern forming position caused by vertical incidence of the electron beam 200 and originating in the amount of charge and the charge amount distribution are calculated, from these amounts.

As the misregistration response table calculation process (S104) in accordance with the main deflection position, the differential table creation unit 502 calculates a response function (first response function) that calculates the misregistration amount (first misregistration amount) in each deflection position (i, j) originating in the amount of charge in each deflection position (i, j) deflecting the electron beam 200. In other words, the differential table creation unit 502 calculates a misregistration response table r[i, j](x, y) in a main deflection position (i, j) and stores the misregistration response table r[i, j](x, y) in the storage device 144. The misregistration response table r[i, j](x, y) is an example of the response function (first response function). The misregistration response table r[i, j](x, y) may be created by another function or a user without being created by the differential table creation unit 502. As described above, the misregistration amount is determined by evaluating a convolution integral of a response function over the charge amount distribution. Thus, the misregistration response table r[i, j](x, y) can be calculated, after the misregistration amount of each deflection position arising in each deflection position (i, j) and originating in the amount of charge and the charge amount distribution are calculated, from these amounts.

As the differential table calculation process (S106), the differential table creation unit 502 calculates a plurality of differential response functions showing a difference between the misregistration response table r[i, j](x, y) in the main deflection position (i, j) and the misregistration response table r0(x, y) assuming a vertically incident electron. In other words, the differential table creation unit 502 calculates a differential table δr[i, j](x, y) and stores the differential table δr[i, j](x, y) in the storage device 142. The differential table δr[i, j](x, y) is an example of the differential response function. The differential table δr[i, j](x, y) can be determined from Formula (1) below:

$$\delta r[i,j](x, y) = r[i, j](x, y) - r0(x, y) \quad (1)$$

In the above example, the misregistration response table r[i, j](x, y) (first response function) and the misregistration response table r0(x, y) (second response function) are stored in the storage device 144 and the differential table δr[i, j](x, y) (differential response function) is stored in the storage device 142, but the present embodiment is not limited to the above example. The misregistration response table r[i, j](x, y) (first response function), the misregistration response table r0(x, y) (second response function), and the differential table δr[i, j](x, y) (differential response function) may be stored in the same storage device. Alternatively, the misregistration response table r[i, j](x, y) (first response function), the misregistration response table r0(x, y) (second response function), and the differential table δr[i, j](x, y) (differential response function) may all be stored in different storage devices. Alternatively, the misregistration response table r[i, j](x, y) (first response function) and the differential table δr[i, j](x, y) (differential response function) may be stored in the same storage device and the misregistration response table r0(x, y) (second response function) in another storage device. Alternatively, the misregistration response table r0(x, y) (second response function) and the differential table δr[i, j](x, y) (differential response function) may be stored in the same storage device and the misregistration response table r[i, j](x, y) (first response function) in another storage device.

Figure 9:
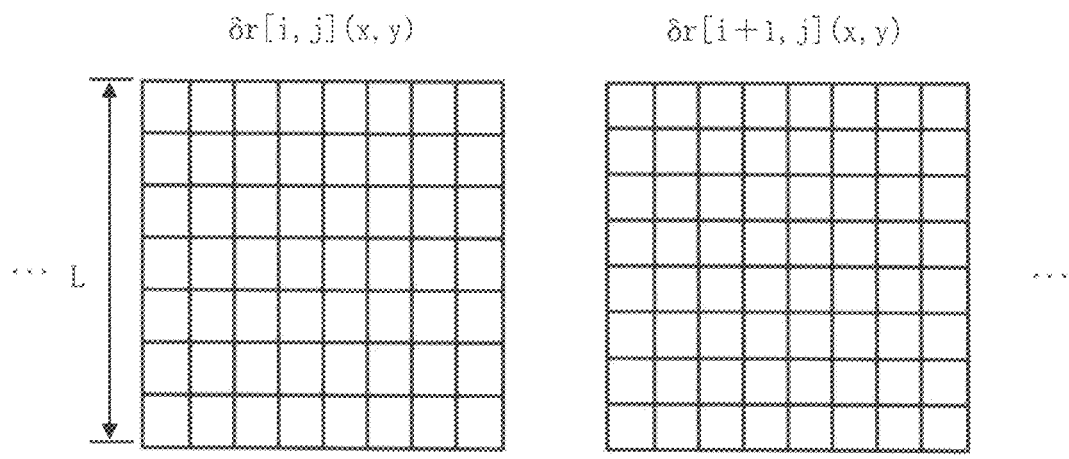
FIG. 9 is a diagram showing an example of a differential table in the first embodiment.

FIG. 9 is a diagram showing an example of the differential table in the first embodiment. As shown in FIG. 9, for example, a plurality of differential tables δr[i, j](x, y) is prepared in accordance with the main deflection position (i, j). Each differential table δr[i, j](x, y) is stored in the storage device 142. The calculation range of the differential table δr[i, j](x, y) is indicated by the range of L×L. As described above with reference to FIG. 7, the calculation range can be made narrower by using the differential table δr[i, j](x, y) than when the misregistration response table r0(x, y) is used. In the example in FIG. 7, for example, the calculation range can be controlled to L=13.5 (radius)×2 times=27 mm, while the calculation range is 20 mm (radius)×2 times=40 mm when the misregistration response table r0(x, y) is used.

As the misregistration correction value calculation process (S108) for vertical incidence, the offline charge correction calculation unit 504 calculates a misregistration correction value map dX(x, y), dY(x, y) based on the misregistration response table r0(x, y), which is a response function for vertical incidence on the main deflection center. The correction value map dX(x, y) shows a correction value in the x direction and dY(x, y) shows a correction value in the y direction. The correction value map dX(x, y), dY(x, y) is stored in the storage device 146. The misregistration amount can be determined by determining a charge amount distribution and evaluating a convolution integral of the misregistration response table r0(x, y) over the charge amount distribution.

For example, a value obtained by reversing the sign of the misregistration amount can appropriately be used as the correction value.

As a pattern forming data processing process, the pattern forming data processing unit 112 reads relevant layout data from pattern forming data stored in the storage device 140 for each frame region and performs data processing of a plurality of columns to generate shot data in a format specific to the pattern forming apparatus inside the pattern forming apparatus 100.

Then, as the initialization process (S110), the pattern area density distribution calculation unit 114 initializes the pattern area density distribution. The dose distribution calculation unit 116 initializes the dose distribution. The fog electron amount distribution calculation unit 118 initializes the fog electron amount distribution. The charge amount distribution calculation unit 122 initializes the charge amount distribution. If nothing has been calculated, this process can be omitted.

As the arithmetic process (S112) to calculate the pattern area density distribution, dose distribution, irradiation amount distribution, and fog electron amount distribution, the pattern area density distribution calculation unit 114 calculates the distribution of pattern area density in each mesh region for each frame obtained by virtual division into mesh shapes of predetermined dimensions based on graphic data contained in layout data read from the storage device 140. The dose distribution calculation unit 116 calculates the distribution of dose amount (irradiation amount density) by using a proximity effect correction formula of back scattered electrons described later. The fog electron amount distribution calculation unit 118 calculates the distribution of fog electron amount based on the distribution of irradiation amount of an electron beam obtained based on the distribution of pattern area density and the distribution of dose amount and a function describing the spread of fog electrons.

Figure 10:
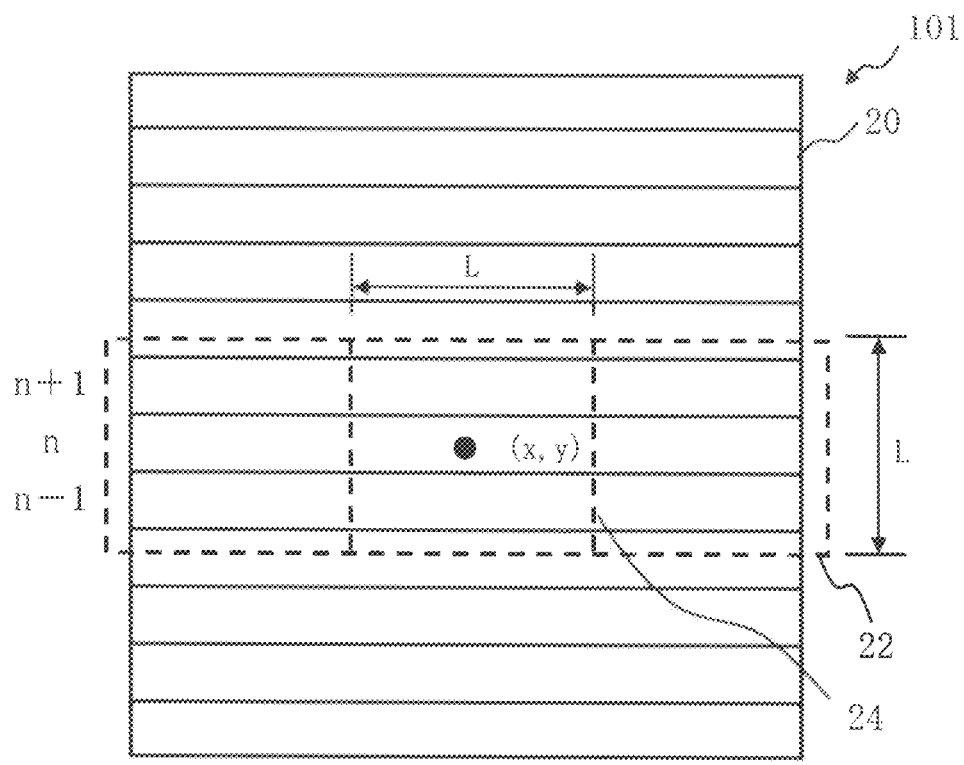
FIG. 10 is a diagram showing an example of a frame region and a misregistration calculation range in the first embodiment.

FIG. 10 is a diagram showing an example of a frame region and a misregistration calculation range in the first embodiment. In FIG. 10, when a pattern is formed on the target object 101, one stripe region of the target object 101 virtually divided into a plurality of stripe regions in a thin rectangular shape over whose pattern forming (exposure) surface the electron beam 200 can be deflected by the main deflector 208 is irradiated with the electron beam 200 while the XY stage 105 is continuously moved in, for example, the X direction. The stripe region is virtually divided into a plurality of subfields (SF) in a mesh shape over which the electron beam 200 can be deflected by the sub-deflector 210 and a pattern is formed for each SF. The XY stage 105 is to be moved in the X direction, for example, continuously and at the same time, the shot position of the electron beams 200 is caused to follow the stage movement. More specifically, a deflection position is aligned with the reference position of the SF by the main deflector 208 and the deflection position of the main deflector 208 is caused to follow the stage movement. Then, the shot position inside the SF is irradiated with the electron beam 200 by the sub-deflector 210. The pattern forming time can be reduced by causing the XY stage 105 to move continuously. Then, if pattern formation in one stripe region is finished, after step feeding of the XY stage 105 in the Y direction, a pattern forming operation of the next stripe region is performed in the X direction (this time, in the opposite direction). The movement time of the XY stage 105 can be reduced by performing the pattern forming operation of each stripe region in serpentine motion. In the pattern forming apparatus 100, when layout data (pattern forming data) is processed, the pattern forming region is divided into a plurality of frame regions 20 in a thin rectangular shape to perform data processing for each of the frame regions 20. If, for example, multiple-exposure is not performed, the frame regions 20 and the above stripe regions are the same regions. If multiple-exposure is performed, the frame regions 20 and the above stripe regions are shifted in accordance with multiplicity. Alternatively, the pattern forming region is virtually divided into the plurality of frame regions 20 to be the same region as the stripe region in accordance with multiplicity and data processing is performed for each of the frame regions 20. Therefore, the pattern forming region of the target object 101 is virtually divided into the plurality of frame regions 20 (stripe regions) to be pattern forming unit regions and the pattern generator 150 forms a pattern for each of the frame regions 20 (stripe regions).

As described above, the control computer 110 that generates shot data makes a calculation for each of the frame regions 20. Thus, regarding the pattern area density distribution, dose distribution, irradiation amount distribution, and fog electron amount distribution, a calculation is similarly made for each of the frame regions 20. If, for example, a calculation of an n-th frame is made, the deflection control circuit 170 performs calculation processing of an (n−1)-th frame. When the control computer 110 calculates the pattern area density distribution, dose distribution, irradiation amount distribution, or fog electron amount distribution of an (n+1)-th frame, the deflection control circuit 170 performs calculation processing of the n-th frame. Thus, calculation processing proceeds like the so-called pipeline processing.

First, as a pattern area density distribution $\rho(x, y)$ arithmetic process, the pattern area density distribution calculation unit 114 reads the relevant layout data from the storage device 140 for each frame region and virtually divides the frame region further into a plurality of sub-fields (x, y) to calculate a pattern area density $\rho$ for each sub-field. By performing the above operation for the whole frame regions, the pattern area density distribution $\rho(x, y)$ is calculated for each frame region.

Then, as a dose (irradiation amount density) distribution D(x, y) arithmetic process, the dose distribution calculation unit 116 calculates a dose distribution D(x, y) for each sub-field. The dose amount distribution D(x, y) is calculated according to a proximity effect correction formula (2) of back scattered electrons:

$$D = D_0 \times \{(1+2\times\eta)/(1+2\times\eta\times\rho)\} \quad (2)$$

(In the above formula (2), $D_0$ is a reference dose amount and $\eta$ is a back scattering rate.)

The reference dose amount $D_0$ and the back scattering rate $\eta$ are set by the user of the pattern forming apparatus 100. The back scattering rate $\eta$ can be set by considering the acceleration voltage of the electron beam 200, the resist film thickness of the target object 101, the type of the substrate, process conditions (for example, PEB conditions and phenomenal conditions) and the like.

Subsequently, as a fog electron amount distribution F(x, y, $\sigma$) arithmetic process, the fog electron amount distribution calculation unit 118 calculates a fog electron amount distribution F(x, y, $\sigma$) by using an irradiation amount distribution E(x, y) (also called a "irradiation intensity distribution") for each mesh region obtained by multiplying a pattern area density distribution $\rho(x, y)$ by a dose amount distribution D(x, y).

It is assumed that a function g(x, y) describing a spread distribution of fog electrons with regard to the irradiation amount distribution E(x, y) is present. The function g(x, y) is, for example, a model of the Gaussian distribution and can be expressed as Formula (3) below. $\sigma$ denotes a fog influence radius.

$$g(x,y) = (1/\pi\sigma^2)\times\exp\{-(x^2+y^2)/\sigma^2\} \quad (3)$$

Then, as shown in Formula (4) below, the fog electron amount distribution (also called "fog electron amount intensity") F(x, y, $\sigma$) can be determined by evaluating a convolution integral of the spread distribution function g(x, y) and the irradiation amount distribution E(x, y).

$$F(x, y, \sigma) = \iint g(x-x'', y-y'')E(x'', y'')dx''dy'' \quad (4)$$

As the charge amount distribution arithmetic process (S114), the charge amount distribution calculation unit 122 calculates a charge amount distribution C(x, y) charged by vertical incidence of the electron beam 200 on the pattern forming region of the target object 101 for each frame region. More specifically, when a pattern is formed in the relevant frame region, the charge amount C(x, y) in each position (x, y) inside frame regions up to the previous frame region is determined.

It is needless to say that the charge amount C in each position (x, y) up to the (n−1)-th frame when, for example, a relevant frame region 20 currently being calculated is the n-th frame region and the charge amount C in each position (x, y) up to the n-th frame when the relevant frame region 20 is the (n+1)-th frame region may be different even in the same position. This is because the charge amount is accumulated.

A function C(E, F) to determine the charge amount distribution C(x, y) from the irradiation amount distribution E(x, y) and the fog electron amount distribution F(x, y, $\sigma$) is assumed. This assumed function C(E, F) is divided, like Formula (5), into a variable $C_E(E)$ to which irradiation electrons contribute and a variable $C_{Fe}(F)$ to which fog electrons contribute.

$$C(E, F) = C_E(E) + C_{Fe}(F) \quad (5)$$

Further, the function for the non-irradiation region is assumed to be $C_E(E) = 0$, that is, $C(E, F) = C_F(F)$.

First, the relationship between the charge amount distribution $C_F(F)$ and electron amount intensity F for a non-irradiation region can be expressed by a polynomial function like Formula (6) below. In Formula (6) below, $f_1$, $f_2$, and $f_3$ are constants.

$$C_F(F) = f_1 \times F + f_2 \times F^2 + f_3 \times F^3 \quad (6)$$

Next, the charge amount distribution C(E, F) for an irradiation region can be defined by a polynomial function like Formula (7) below:

$$\begin{aligned}C(E, F) &= C_E(E) + C_{Fe}(F) \\ &= (d_0 + d_1 \times \rho + d_2 \times D + d_3 \times E) + \\ &\quad (e_1 \times F + e_2 \times F^2 + e_3 \times F^3)\end{aligned} \quad (7)$$

F is the fog electron amount distribution for an irradiation region determined by Formula (4) using the optimal fog radius $\sigma$. In the irradiation region, not only the variable $C_E(E)$ to which irradiation electrons contribute, but also the variable $C_{Fe}(F)$ to which fog electrons contribute is considered. Parameters $d_0$, $d_1$, $d_2$, $d_3$, $e_1$, $e_2$, and $e_3$ are constants.

Then, the charge amount distribution C(x, y) is determined as a union of $C_F(F)$ of the above Formula (6) for a non-irradiation region and C(E, F) of the above Formula (7) for an irradiation region.

As described above, the charge amount distribution C(x, y) is calculated for each frame region. Then, the calculated charge amount distribution C(x, y) for each frame region is stored in the storage device 146 or the like. Thus, when pattern forming processing of the n-th frame is performed, the charge amount distributions C(x, y) up to the (n−1)-th frame are already stored.

As the SF position correction process (S116) for vertical incidence, the offline charge correction application unit 126 has misregistration correction values dX0($x$, y), dY0($x$, y) input from the storage device 146 to calculate an SF position (Xm', Ym') after the charge correction based on the SF position (Xm, Ym) to be a pattern forming target of the n-th frame by using misregistration correction values determined offline. The SF position (Xm', Ym') after the charge correction can be determined by Formula (8) below:

$$Xm'=Xm+dX0(Xm, Ym), Ym'=Ym+dY0(Xm, Ym) \tag{8}$$

As the charge amount distribution cutout process (S118), the charge amount distribution cutout unit 124 cuts out a partial charge amount distribution Csub(x, y) in the calculation range from the calculated charge amount distribution C(x, y) and outputs the partial charge amount distribution Csub(x, y) to the deflection control circuit 170. As described above with reference to FIGS. 7 and 9, the calculation range in the first embodiment can be made narrower by using the differential table δr[i, j](x, y) than the calculation range when the misregistration response table r0($x$, y) is used. In the example in FIG. 7, for example, the calculation range can be controlled to L=13.5 (radius)×2 times=27 mm, while the calculation range is 20 mm (radius)×2 times=40 mm when the misregistration response table r0($x$, y) is used. Thus, the charge amount distribution C(x, y) of the frame region positioned in the range of a width L before and after the relevant frame region 20 may be cut out as the partial charge amount distribution Csub(x, y). If, for example, the SF position (Xm', Ym') of the n-th frame is calculated, the charge amount distribution C(x, y) of a frame positioned in the range of L/2 from the n-th frame among frames up to the (n−1)-th frame may be cut out. The charge amount distribution C(x, y) of the (n+1)-th frame and thereafter is not yet calculated and so there is no data thereof.

As the SF correction position acquisition process (S120) for vertical incidence, the SF position acquisition unit 172 acquires the SF position (Xm', Ym') after the charge correction for vertical incidence as input from the control computer 110.

As the stage position acquisition process (S122), the stage position acquisition unit 174 acquires the stage position (XL, YL) for pattern formation in the SF position (Xm, Ym) to be a pattern forming target as input from the stage position detection unit 136.

As the main deflection position identification process (S124), the main deflection position calculation unit 176 identifies the position (i, j) inside the main deflection region of irradiation of the electron beam 200 by calculating a main deflection position (i, j) (main deflection grid division index).

Figure 11:
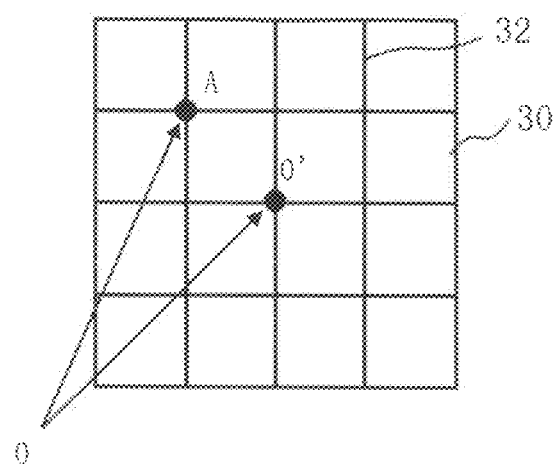
FIG. 11 is a diagram showing an example of a stage position and a deflection position in the first embodiment.
Figure 12:
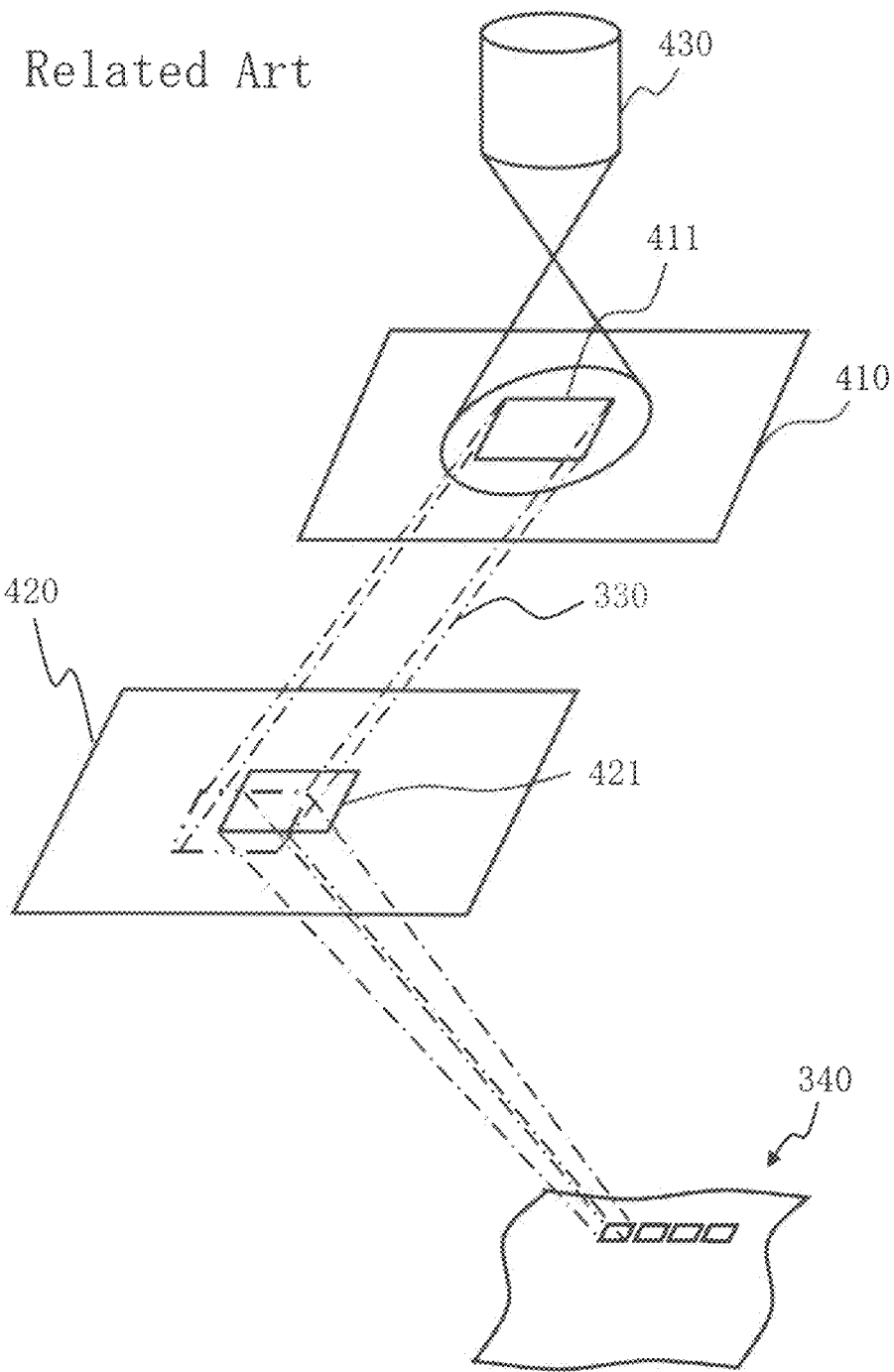
FIG. 12 is a conceptual diagram for explaining an operation of a variable-shaped electron beam pattern forming apparatus.

FIG. 11 is a diagram showing an example of the stage position and the deflection position in the first embodiment. Coordinates (XL, YL) of a stage position O' and coordinates (Xm', Ym') of an SF position A after a charge correction are both shown as coordinates from an origin O serving as the reference. The stage position O' indicates, for example, the center position of the relevant main deflection region 30. The electron beam 200 is incident on the position vertically. However, a position deflected from the center position of the main deflection region 30 by the main deflector 208 is actually irradiated with the electron beam 200 and thus, coordinates (indices) (i, j) inside the main deflection region 30 are identified. Here, the deflection position (i, j) is identified by dividing the relevant main deflection region 30 by a predetermined width of a grid 32. The deflection position (i, j) can be determined by Formula (9) below:

$$i=(Xm'-XL)/\text{main deflection grid division width}$$

$$j=(Ym'-YL)/\text{main deflection grid division width} \tag{9}$$

As the differential table selection process (S126), the differential table transfer unit 120 (transfer unit) transfers a plurality of differential tables δr[i, j](x, y) stored in the storage device 144 to the deflection control circuit 170. Then, the differential table selection unit 178 (selection unit) selects one of the plurality of differential tables δr[i, j](x, y) in accordance with the deflection position (i, j) from among the plurality of transferred differential tables δr[i, j](x, y) that had been stored in the storage device 144.

As the calculation region decision process (S128), the region decision unit 180 has the partial charge amount distribution Csub(x, y) input thereto to decide the calculation range for convolution integral using the differential table δr[i, j](x, y) selected therefrom. In FIG. 10, a square range of L in length and width with the center in the relevant position (x, y) of a frame region group 22 in the range of the partial charge amount distribution Csub(x, y) is decided as a calculation range 24. As described above with reference to FIGS. 7 and 9, the calculation range can be made narrower by using the differential table δr[i, j](x, y) than the calculation range when the misregistration response table r0($x$, y) is used. In the example in FIG. 7, for example, the calculation range can be controlled to L=13.5 (radius)×2 times=27 mm, while the calculation range is 20 mm (radius)×2 times=40 mm when the misregistration response table r0($x$, y) is used. Therefore, the calculation range 24 can be made narrower.

As the main deflection position dependent correction value calculation process (S130), the correction position calculation unit 182 calculates deflection position dependent correction values (dXij, dYij) that correct a remaining misregistration amount (third misregistration amount) dependent each deflection position obtained by subtracting a second misregistration amount for vertical incidence from a first misregistration amount in each deflection position (i, j) by using a charge amount distribution (here, the partial charge amount distribution Csub(x, y)). The first misregistration amount is a misregistration amount of the deflection position caused by the amount of charge in each deflection position (i, j) where the electron beam 200 is deflected. The second misregistration amount is a misregistration amount of the pattern forming position caused by vertical incidence of the electron beam 200 and is caused by the amount of charge. The correction position calculation unit 182 is an example of a deflection position dependent correction value calculation unit. The correction position calculation unit 182 calculates the deflection position dependent correction values (dXij, dYij) by using one differential table δr[i, j](x, y) selected from a plurality of differential tables δr[i, j](x, y). The deflection position dependent misregistration amount can be determined by evaluating a convolution integral of the differential table δr[i, j](x, y) over the partial charge amount distribution Csub(x, y) and thus, the correction values (dXij, dYij) can be obtained by, as shown in Formula (10) below, reversing the sign of the deflection position dependent misregistration amount. Note that the symbol "●" in Formula (10) indicates the convolution integral.

$$(dXij, dYij)=-\delta r[i,j](x, y) \bullet C\text{sub}(x, y) \tag{10}$$

As the position correction process (S131), the position correction unit 183 calculates a corrected position (Xm", Ym") by, as shown in Formula (11) below, adding the deflection position dependent correction values (dXij, dYij) to the SF position (Xm', Ym').

$$Xm''=Xm'+dXij, Ym''=Ym'+dYij \quad (11)$$

Thus, the position correction unit 183 calculates the corrected position by adding the deflection position dependent correction values to the vertical incidence corrected position corrected by using the vertical incidence correction values that correct the second misregistration amount of the pattern forming position caused by vertical incidence of an electron beam and originating in the amount of charge.

As described above, the SF position (Xm', Ym') becomes a vertical incidence corrected position corrected for vertical incidence. The SF position (Xm', Ym') includes values corrected by using a correction value map dX(x, y), dY(x, y) that corrects the second misregistration amount of the pattern forming position caused by vertical incidence of the electron beam 200 and originating in the amount of charge C. As described above, the correction value map dX(x, y), dY(x, y) includes vertical incidence correction values corrected for vertical incidence.

The position correction unit 183 calculates, using the charge amount distribution C as described above, the corrected position (Xm", Ym") in each pattern forming position corrected for the misregistration amount including the misregistration amount in the deflection position dependent on the deflection position where an electron beam is deflected and originating in the amount of charge. Accordingly, the misregistration amount including the misregistration amount in the deflection position dependent on the deflection position where an electron beam is deflected and originating in the amount of charge can be corrected.

As the deflection amount arithmetic process (S132), the deflection amount calculation unit 184 calculates a deflection amount to be applied to the main deflector 208 so that the corrected position is irradiated with the electron beam 200. Then, As the pattern forming process (S134), the pattern generator 150 forms a pattern in the corrected position (Xm", Ym") of the relevant SF of the n-th frame of the target object 101 by using the electron beams 200.

Then, when pattern formation of the n-th frame is finished, the calculation to form a pattern for the next (n+1)-th frame and pattern forming processing are similarly performed. That is, when the corrected position (Xm", Ym") of the SF in the (n+1)-th frame is calculated, operations of the charge amount distribution C up to the n-th frame are completed and thus, each piece of information of the pattern area density distribution p, dose distribution D, irradiation amount distribution E, fog electron amount distribution F, and charge amount distribution C may successively be updated.

According to the first embodiment, as described above, misregistration of the irradiation position taking deflection position dependency into consideration and originating in the amount of charge can be corrected. As a result, a pattern is formed in a highly precisely corrected position so that a high-precision pattern position can be obtained.

Processing content or operation content of a " . . . unit" or " . . . process" in the above description can be configured by a computer operable program. Alternatively, processing content or operation content may be carried out not only by a program to be software, but also by a combination of hardware and software. Alternatively, firmware may also be combined. When configured by a program, the program is stored in a recording medium such as a magnetic disk drive, magnetic tape device, FD, and ROM (read-only memory). For example, the program is stored in the storage device 142, 144, or 146.

The control computer 110 in FIG. 1 or elsewhere may be connected to a RAM (random access memory), ROM, or magnetic disk (HD) drive as an example of the storage device, a keyboard (K/B) or mouse as an example of an input unit, a monitor or printer as an example of an output unit, or an external interface (I/F), FD, DVD, or CD as an example of an input/output unit via a bus (not shown).

The embodiment has been described above with reference to the concrete examples. However, the present invention is not limited to the concrete examples. For example, an electron beam pattern forming apparatus of variable-shaped beam type is used in the above embodiment, but the present invention can also be applied to pattern forming apparatuses of other types. In the above embodiment, for example, an electron beam is used, but the present invention is not limited to the electron beam and is also applicable when other charged particle beams such as an ion beam is used. Moreover, the present invention does not limit the purpose of using an electron beam pattern forming apparatus. In addition to the purpose of forming a resist pattern directly on a mask or wafer, the electron beam pattern forming apparatus can be used when, for example, an optical stepper mask or X-ray mask is created.

In the above examples, the configuration in which the deflection position is controlled by two-stage main/sub-deflectors of the main deflector 208 and the sub-deflector 210 is shown, but the present invention is not limited to such an example. The charge correction can also be made similarly when a charged particle beam is deflected by one-stage deflector or three-stage deflectors or more.

Parts of the apparatus configuration, the control method, and the like which do not need to be explained directly for the explanation of the present invention are not described. However, a necessary apparatus configuration and a necessary control method can be appropriately selected and used. For example, a control unit configuration which controls the pattern forming apparatus 100 is not described. However, a necessary control unit configuration is appropriately selected and used, as a matter of course.

In addition, all charged particle beam pattern forming apparatuses and charged particle beam pattern forming methods which include the elements of the present invention and can be attained by appropriately changing in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam pattern forming apparatus, comprising:
    a charge amount distribution calculation unit configured to calculate a charge amount distribution charged by vertical incidence of a charged particle beam on a pattern forming region of a target object;
    a position correction unit configured to calculate, using the charge amount distribution, a corrected position of each pattern forming position corrected for a misregistration amount including a misregistration amount dependent on a deflection position where the charged particle beam is deflected, the misregistration amount caused by an amount of charge; and a pattern generator configured to form a pattern in the corrected position by using the charged particle beam.

2. The apparatus according to claim 1, further comprising a deflection position dependent correction value calculation unit configured to calculate a deflection position dependent correction value that corrects a remaining misregistration amount dependent on each deflection position obtained by subtracting, from a first misregistration amount caused by the amount of charge in each deflection position where the charged particle beam is deflected, a second misregistration amount of the pattern forming position caused by vertical incidence of the charged particle beam, by using the charge amount distribution, wherein the position correction unit calculates the corrected position by adding the deflection position dependent correction value to a vertical incidence corrected position corrected by using a vertical incidence correction value that corrects the second misregistration amount of the pattern forming position caused by the vertical incidence of the charged particle beam.

3. The apparatus according to claim 2, further comprising a storage device configured to store a plurality of differential response functions showing a difference between a first response function that calculates the first misregistration amount caused by the amount of charge in each deflection position where the charged particle beam is deflected and a second response function that calculates the second misregistration amount of each pattern forming position caused by the vertical incidence of the charged particle beam, wherein the deflection position dependent correction value calculation unit calculates the deflection position dependent correction value by using one of the plurality of differential response functions.

4. The apparatus according to claim 3, further comprising a selection unit configured to select one of the plurality of differential response functions in accordance with the deflection position, wherein the deflection position dependent correction value calculation unit calculates the deflection position dependent correction value by using one of the plurality of differential response functions that has been selected.

5. The apparatus according to claim 3, further comprising a transfer unit configured to transfer the plurality of differential response functions stored in the storage device.

6. The apparatus according to claim 5, further comprising a selection unit configured to select one of the plurality of differential response functions in accordance with the deflection position from among the plurality of differential response functions transferred.

7. The apparatus according to claim 3, further comprising a charge amount distribution cutout unit configured to cut out a partial charge amount distribution from the calculated charge amount distribution.

8. The apparatus according to claim 7, further comprising:
a selection unit configured to select one of the plurality of differential response functions in accordance with the deflection position; and a decision unit configured to input the partial charge amount distribution and to decide a calculation range of convolution integral with the differential response function selected, from among the partial charge amount distribution.

9. The apparatus according to claim 8, wherein the deflection position dependent correction value calculation unit is configured to calculate the deflection position dependent correction value by using the partial charge amount distribution.

10. A charged particle beam pattern forming method comprising:
calculating a charge amount distribution charged by vertical incidence of a charged particle beam on a pattern forming region of a target object;

calculating a corrected position in each pattern forming position corrected for a misregistration amount including a misregistration amount dependent on a deflection position where the charged particle beam is deflected, the misregistration amount caused by an amount of charge; and forming a pattern in the corrected position by using the charged particle beam.

* * * * *